United States Patent [19]

Benjamin

[11] 4,384,278

[45] May 17, 1983

[54] ONE-BIT CODEC WITH SLOPE OVERLOAD CORRECTION

[75] Inventor: O'Connell J. Benjamin, Marlboro, N.J.

[73] Assignee: Bell Telephone Laboratories, Incorporated, Murray Hill, N.J.

[21] Appl. No.: 285,861

[22] Filed: Jul. 22, 1981

[51] Int. Cl.³ .......................................... H03K 13/22
[52] U.S. Cl. .............................. 340/347 AD; 375/30; 375/34; 332/11 D
[58] Field of Search ................ 340/347 AD, 347 DA, 340/347 M; 332/11 D; 375/28, 29, 30, 31, 32, 34

[56] References Cited

U.S. PATENT DOCUMENTS

| | | | |
|---|---|---|---|
| 3,922,606 | 11/1975 | Nordling | 375/30 |
| 3,925,731 | 12/1975 | Brainard | 340/347 DA |
| 4,008,435 | 2/1977 | Oshima | 340/347 AD X |
| 4,042,921 | 8/1977 | Smith | 340/347 AD |
| 4,059,800 | 11/1977 | Jones | 375/30 |
| 4,208,740 | 6/1980 | Yin | 375/30 |

OTHER PUBLICATIONS

Everard, "Electronics Letters", Jul. 22, 1976, vol. 12, No. 15, pp. 379-380.
Candy, "IEEE Transactions on Communications", vol. COM-24, No. 1, Jan. 1976, pp. 33-42.
Candy, "National Telecommunications Conference", Dec. 2-4, 1974, pp. 388-391.
Ritchie, "IEEE Transactions on Communications", vol. COM-22, No. 11, Nov. 1974, pp. 1797-1806.
Bosworth, "The Bell System Technical Journal", vol. 48, No. 5, May-Jun. 1969, pp. 1459-1479.
Abate, "Proceedings of the IEEE", vol. 55, No. 3, Mar. 1967, pp. 298-308.

Primary Examiner—C. D. Miller
Attorney, Agent, or Firm—Ronald D. Slusky; Roy C. Lipton

[57] ABSTRACT

In a delta modulation coder and decoder system, the disadvantageous effects of slope overload are eliminated by reversing the polarity of the feedback signal in the coder and the polarity of the reconstructed analog signal in the decoder whenever slope overload correction is required. This is accomplished by the addition, to both the coder and decoder, of control circuitry which determines whether slope overload correction is required. To make the determination, first the digital output signal of the coder is tested to determine whether its rate of change is equal to a maximum value. Second, the magnitude of the feedback signal is tested to see if it lies below a threshold value. If both these conditions are satisfied, slope overload correction is then performed.

23 Claims, 2 Drawing Figures

ONE-BIT CODEC WITH SLOPE OVERLOAD CORRECTION

BACKGROUND OF THE INVENTION

1. Field of the Invention

This invention relates to apparatus which converts an analog signal to a serial digital signal and converts a serial digital signal to an analog signal, and more particularly, to apparatus for a delta modulation coder and decoder.

2. Description of the Prior Art

A delta modulation coder converts an analog signal, applied to a terminal located at the near end of a communication channel, to a serial digital form particularly suitable for transmission over the communication channel. A delta modulation decoder, located within a similar terminal at the far end, reconstructs the analog signal from the serial digital signal transmitted over the channel.

In a delta modulation coder, the amplitude of an analog input signal is compared to a feedback or reconstructed analog signal, which approximates the analog input signal from a prior time interval. The resulting error, or difference, signal is integrated and sampled to produce a digital output signal. This output signal is binary, i.e. it is either "high" or "low." If at the sampling time, this digital output signal is high, then it indicates that the analog input signal is greater than the feedback signal. On the other hand, if the digital output signal is low, then the analog input signal at the sampling time is less than the feedback signal.

The digital output signal is applied to an output terminal, and is also fed back to a digital integrator. The output of the latter is the feedback signal, which more particularly, is a reconstructed analog signal whose amplitude increases or decreases by a known incremental or discrete amount, referred to as the "step size," in response to each binary state of the digital output signal.

From the output terminal, the digital output signal is transmitted over a communication channel to a decoder, situated at the far end. Within the delta modulation decoder, a digital integrator—substantially identical to that in the coder—integrates the digital output signal incoming from the channel. The result is then applied to a low-pass filter which in response thereto produces a reconstructed analog signal which is substantially equivalent to the analog signal applied to the coder.

At any instant, the digital output of the delta modulation coder defines a corresponding change in the analog input signal and occurs at substantially the same time as that change. However, the feedback signal in the coder and the reconstructed analog signal in the decoder is unable to follow rapid changes in the slope of the analog input signal. Consequently, as the slope of the analog input signal increases, the magnitude of both the feedback signal in the coder and the reconstructed analog signal in the decoder disadvantageously and increasingly lags behind (in time) that of the analog input signal. This condition is known as "slope overload." It basically arises because (1) the coder's digital output signal is binary and (2) the coder is operated at a fixed maximum speed dictated by the frequency of the sampling clock. Consequently, changes in the feedback signal in the coder and the reconstructed analog signal in the decoder are restricted by the binary input to one discrete step-size at a time and to a fixed maximum rate governed by the clock frequency. Thus, during an interval of slope overload, both the feedback signal and the analog signal reconstructed at the receiving end become significantly distorted.

Various solutions aimed at eliminating slope overload have been put forth in the art. One such solution is to incorporate a slope limiter in the input circuit of the delta modulator to limit the slope of the analog input signal to a value below which slope overload will not occur. See U.S. Pat. No. 4,008,435 (issued Feb. 15, 1977 to T. Oshima et al). While this technique does prevent slope overload from occurring, the slope limiter significantly slows the response of the delta modulator to a rapidly changing analog input signal.

Another solution is to increase the frequency of sampling the integrated error signal to, for example, 8 megahertz or greater for the transmission of voiceband signals. However, as the sampling rate is increased, so is the bandwidth required to transmit the digital output signal. Moreover, analog integrators exhibit increased instability at increased sampling frequencies. To attain stability at an increased sampling frequency, increased circuit sophistication becomes necessary and substantial added costs are incurred.

A further solution is to increase the step sizes (as the input signal magnitude increases) in a logarithmic basis. This is known as "companding." See, for example, J. C. Candy, W. H. Ninke and B. A. Wooley, "A Per-Channel A/D Converter Having 15-Segment $\mu$-255 Companding," *IEEE Transactions on Communications*, VOL. COM-24, No. 1, January 1976, pp. 33–42; and U.S. Pat. No. 3,925,731 (issued Dec. 9, 1975 to R. C. Brainard et al and hereinafter referred to as the '731 patent). Unfortunately, since the step sizes are small when the feedback signal amplitude is small, companding has little effect whenever there is rapid changes of a low amplitude input signal. One solution which overcomes this, and thereby reduces slope overload, involves increasing the step size whenever slope overload is detected. See R. H. Bosworth and J. C. Candy, "A Companded One-Bit Coder for Television Transmission," *The Bell System Technical Journal*, Vol. 48, No. 5, May-June, 1969, pp. 1459–1479, and J. E. Abate "Linear and Adaptive Delta Modulation," *Proceedings of the IEEE*, Vol. 55, No. 3, March 1967, pp. 298–308. A companded coder which employs this technique is described in U.S. Pat. No. 4,042,921 (issued to P. L. Smith on Aug. 16, 1977). There, the step size is logarithmically adjusted based on the average peak slope of the analog input signal rather than the instantaneous slope. Unfortunately, coders which rely on varying step sizes tend to be violently unstable during slope overload.

SUMMARY OF THE INVENTION

Accordingly, it is an object of this invention to provide a simple method for use in a delta modulation coder and/or decoder which substantially eliminates the effects of slope overload.

It is a further object of this invention to provide a simple arrangement for a delta modulation coder and/or decoder which substantially eliminates the effects of slope overload without slowing the response of the coder and/or decoder to a rapidly changing analog input signal.

It is another object of this invention to provide a simple arrangement for use in a delta modulation coder and/or decoder which substantially eliminates the effects of slope overload while requiring only a minimal amount of added cost and circuit sophistication.

It is yet another object of this invention to provide a simple technique and arrangement for use in a delta modulation coder and/or decoder which maintains circuit stability during any interval during which slope overload correction occurs.

These and other objects are achieved in accordance with the invention by reversing the polarity of the feedback signal in the coder and/or the polarity of the reconstructed analog signal in the decoder whenever slope overload is detected. This polarity change in the feedback and reconstructed analog signals permits them to periodically lead (in time) rather than always lag behind the analog input signal. In this manner, the average rate of change of both the feedback and reconstructed analog signals is, over the course of the period of slope overload, able to keep up with that of the analog input signal.

Slope overload correction is readily accomplished, in accordance with a specific implementation disclosed herein, by the addition, to both the coder and decoder, of control circuitry which tests for slope overload and then corrects for its effects. To determine the occurrence of slope overload, the control circuitry tests the digital output signal to determine if a maximum rate of change of the input signal is occurring. If the digital output signal indicates continuous change of the input signal over a predetermined interval of time, slope overload is said to occur. Coincidentally, the control circuitry in both the coder and decoder determines whether slope overload correction is required, and, if so, it reverses the polarity of the feedback signal in the coder and the polarity of the reconstructed analog signal in the decoder.

In accordance with an aspect of the invention, slope overload is said to occur only when the feedback signal amplitude is close to zero. More specifically, the magnitude of the feedback signal is tested to see whether it lies below a threshold value in order to further define those intervals when slope overload correction is required.

In accordance with another aspect of this invention, the magnitude of the feedback signal is held fixed during slope overload correction, and, more particularly, whenever the feedback signal polarity is being reversed, in order to minimize circuit instability.

BRIEF DESCRIPTION OF THE DRAWING

The invention may be clearly understood from a consideration of the following detailed description and accompanying drawing in which.

DETAILED DESCRIPTION

A delta modulation coder converts an analog input signal, applied to a terminal located at the near end, to a serial digital form particularly suitable for transmission over a communication channel. A delta modulation decoder, located within a similar terminal at the far end, reconstructs the analog input signal from the serial digital signal transmitted over the channel.

Figure 1:
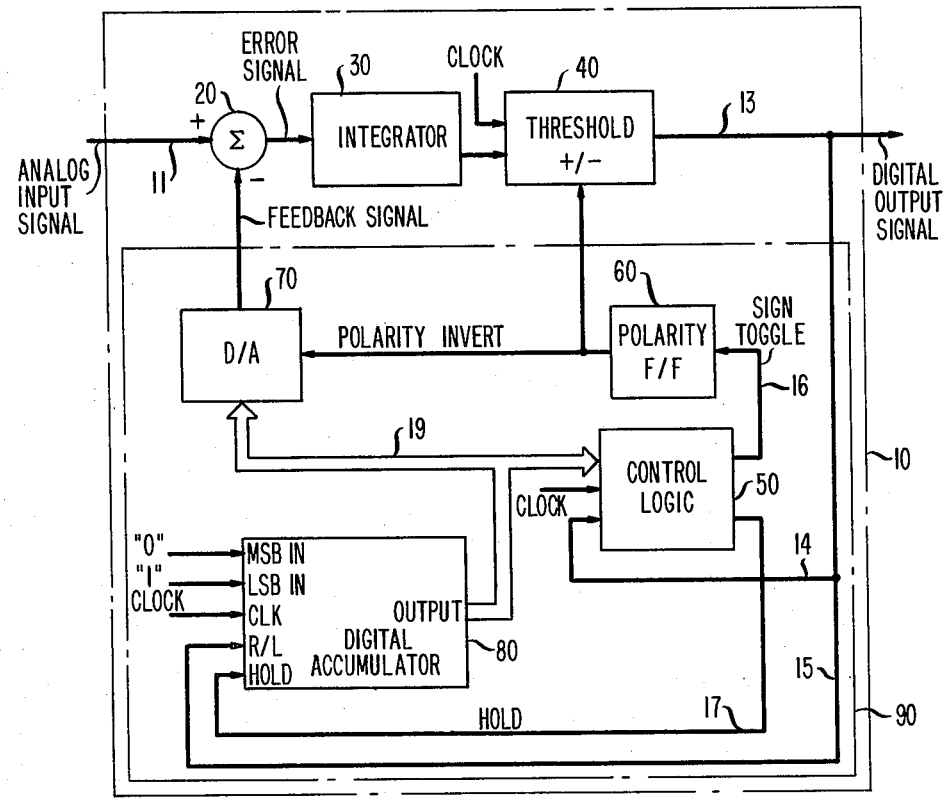
FIG. 1 is a block diagram of a delta modulation coder embodying the principles of this invention.

FIG. 1 depicts a delta modulation coder 10 (hereinafter referred to as coder 10) incorporating slope overload correction circuitry according to the principles of this invention.

An ANALOG INPUT signal is applied to coder 10 over input lead 11. Within coder 10, this input signal is subtracted within combiner 20 from a FEEDBACK or reconstructed analog signal which approximates the ANALOG INPUT signal. The resulting ERROR, or difference, signal is applied to integrator 30 and the resulting integrated error signal is applied to threshold circuit 40. By integrating the ERROR signal prior to its application to threshold circuit 40, the coder's sensitivity to any errors occurring during a sampling interval is increased. Within threshold circuit 40, the integrated error signal is first sampled. Whenever, coincident with the occurrence of a clock pulse, the value of the integrated error signal is below a predetermined level, the threshold circuit 40 output is high, i.e., it produces a pulse or a "1" bit, on lead 13. In the event, the integrated error signal is above this level, threshold circuit 40 does not produce such a pulse.

The pulses appearing on lead 13 are applied to the coder's output terminal (not shown) as the coder's DIGITAL OUTPUT signal. These pulses are also applied via lead 14 to feedback circuitry 90 and, more particularly, to control logic 50 and via lead 15 to a digital integrator comprised of digital accumulator 80 and digital-to-analog converter 70. In response to the DIGITAL OUTPUT signal, the digital integrator produces the FEEDBACK signal.

From the output terminal, the DIGITAL OUTPUT signal is transmitted via suitable transmission circuitry (not shown) through a communication channel to a delta modulation decoder (not shown and hereinafter referred to as the decoder) located within a far end terminal. The decoder is basically comprised of circuitry which is the same as feedback circuitry 90 contained within coder 10. Specifically, within the decoder, the DIGITAL OUTPUT signal incoming from the channel is applied, over leads corresponding to leads 14 and 15 contained within feedback circuitry 90, to a digital integrator. The output of the digital integrator is applied to a low-pass filter which in response thereto produces a reconstructed analog signal which is substantially identical to the analog input signal applied to coder 10. Because of the substantial similarity between the coder and decoder, the remaining discussion will center on the coder and will mention the decoder only when its circuitry and/or operation differs from that of the coder.

Within the coder, digital accumulator 80 stores an accumulated signal which is an 8 bit word and which, at any instant, corresponds to the amplitude of the FEEDBACK signal. This amplitude is modified in response to the present value of the DIGITAL OUTPUT signal. Specifically, if the present value is a "1", i.e., a pulse appearing on lead 13, which means that the value of the ANALOG INPUT signal is less than that of the FEEDBACK signal, then the level of the FEEDBACK signal will decrease. In particular, whenever a pulse, i.e. a "1", in the DIGITAL OUTPUT signal is applied, simultaneously with a clock pulse, to digital accumulator 80, its contents are shifted one location towards the least significant bit location and a "0" is written into the most significant bit location. If, on the other hand, the present value of the DIGITAL OUTPUT signal is a "0", which means that the value of the ANALOG INPUT signal is greater than that of the FEEDBACK signal, then the level of the FEEDBACK signal will increase. Specifically, if no pulse or a "0" appears in the DIGITAL OUTPUT signal at the time the clock pulse occurs, then the contents of digital accumulator 80 are shifted one location towards the most significant bit location and a "1" is written into the least significant bit location. In this manner, digital accumulator 80 generates an accumulated signal which is an 8-bit binary number. At any time, the value of the accumulated signal represents in binary format one of the amplitude levels from the least (all zeros—00000000) to the greatest (all ones—11111111) in the $\mu$-law companding range of the coder. The accumulated signal produced by digital accumulator 80 is applied via bus 19 to the parallel input of digital-to-analog converter 70. The analog output of this converter is the FEEDBACK signal which, more particularly, is a step wave whose amplitude is defined by the 8-bit binary number.

Bus 19 also applies the output of digital accumulator 80 to control logic 50 which senses a "rollover" condition. This condition occurs whenever the contents of the digital accumulator are at a minimum, i.e., "00000000", and, coincident with a clock pulse, no pulse or a "0" appears in the digital output signal applied over lead 15 thereby requiring digital accumulator 80 to further decrease the magnitude of its contents. In response to this condition, control logic 50, sensing this pulse absence on lead 14, produces a pulse on the SIGN TOGGLE signal appearing on lead 16. This pulse is applied to polarity flip-flop 60 to change its state. The output of this flip-flop, the POLARITY INVERT signal, is applied to digital-to-analog converter 70 to invert the polarity of the FEEDBACK signal from either positive to negative or negative to positive.

The POLARITY INVERT signal is also applied to threshold circuit 40 to invert the states of the pulses comprising the DIGITAL OUTPUT signal occurring on lead 13. This latter operation permits the contents of digital accumulator 80 to increment in the proper direction in accordance with both the chosen polarity of the feedback signal and the direction in which its magnitude is changing. In particular, if prior to the rollover condition, the polarity of the FEEDBACK signal was positive and its magnitude had decreased to zero, any further decrease in the FEEDBACK signal after the rollover condition must be in a negative direction. For the FEEDBACK signal to so decrease, its polarity must be negative and its magnitude must increase. This is accomplished by reversing the states of the output pulses produced by threshold circuit 40 whenever the polarity of the FEEDBACK signal is negative. This has the effect of incrementing, i.e., increasing, the magnitude of the FEEDBACK signal whenever the ERROR signal requires the FEEDBACK signal to negatively increase. For further information, relating to accumulating and polarity inverting due to "rollover" the reader is referred to the previously mentioned '731 patent.

Figure 2:
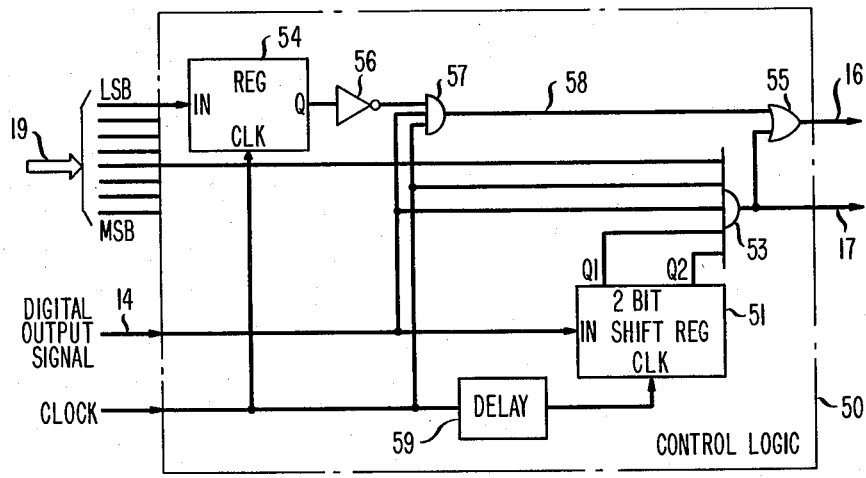
FIG. 2 is a block diagram of the circuitry within control logic 50 shown in FIG. 1 which evokes the process of slope overload correction according to the principles of this invention.

Control logic 50 is shown in detail in FIG. 2. It detects a rollover condition by testing the state of the least significant bit on bus 19. This bit will be zero only at the rollover condition. At the positive edge of every clock pulse, the level of this bit is temporarily stored in register 54. Thereafter, it is applied to the input of inverter 56 which then applies its complement (a "1" at rollover) as one input to AND gate 57. The DIGITAL OUTPUT signal, appearing on lead 14, and the clock are applied to two other inputs of AND gate 57. Consequently, since at the rollover condition the least significant bit is "0", and a pulse in the DIGITAL OUTPUT signal is on lead 14, a pulse is clocked to the output of AND gate 57. This pulse is applied via lead 58 and OR gate 55 to lead 16.

While the coder arrangement thus far described works adequately to digitize most analog input signals, it is particularly susceptible to a condition known as "slope overload". At any instant, the DIGITAL OUTPUT signal of the coder defines the change in the ANALOG INPUT input signal and occurs at substantially the same time as that change. However, as the slope of the ANALOG INPUT signal increases, the rate of change in the FEEDBACK signal becomes unable to follow that of the ANALOG INPUT signal. Consequently, as the slope of the ANALOG INPUT signal increases, the magnitude of the FEEDBACK signal disadvantageously and increasingly lags behind (in time) that of the ANALOG INPUT signal. This condition, referred to as "slope overload", arises because the coder is unable to step through its levels at a rate sufficiently high to match the rate of change in the ANALOG INPUT signal. Two reasons account for this. First, the value of the DIGITAL OUTPUT signal is binary. Consequently, the FEEDBACK signal changes by only one step at a time. Second, the DIGITAL OUTPUT signal changes at a fixed maximum rate governed by the frequency of the sampling clock. Thus, as a result, during an interval of slope overload, both the FEEDBACK signal and the analog signal reconstructed at the far end become significantly distorted.

The present invention, therefore, is directed to a method and arrangement for use in a delta modulation coder and decoder to permit the average rate of change in both the FEEDBACK signal and the analog signal reconstructed at the far end to keep pace with that of the ANALOG INPUT signal—thereby eliminating slope overload. In accordance with the invention, this is achieved by detecting an interval of slope overload and, whenever slope overload correction is required, reversing the polarity of both the FEEDBACK signal and the analog signal reconstructed at the far end.

Slope overload correction is performed within coder 10 by control logic 50, polarity flip-flop 60, digital-to-analog converter 70 and threshold circuit 40. In particular, control logic 50 monitors the pulses comprising the DIGITAL OUTPUT signal appearing on lead 14 to determine when slope overload occurs. Slope overload is arbitrarily said to occur whenever the present value and the two most recent values of the digital output signal are "1," and control logic 50 tests for this condition.

Slope overload correction is only required when the magnitude of the FEEDBACK signal is changing in a way which does not permit it to keep pace with that of the ANALOG INPUT signal. This occurs whenever the magnitude of the FEEDBACK signal is both small and decreasing to zero. Specifically, the steps used in coder 10 are logarithmically spaced, i.e., the magnitude of the step changes in a logarithmic fashion. Thus, whenever the magnitude of the FEEDBACK signal is small and moving towards zero, the magnitude changes by smaller and smaller steps. Thus at these signal levels, the FEEDBACK signal will be unable to follow any present or subsequent rapid changes in the ANALOG INPUT signal. If, on the other hand, the ANALOG INPUT signal rapidly moves away from zero, then the FEEDBACK signal will increase by logarithmically larger valued steps. At these signal levels, the FEEDBACK signal will be able—even for input signals that would normally cause slope overload—to follow any change in the ANALOG INPUT signal, thereby precluding the need for slope overload correction. Consequently, control logic 50 also tests the magnitude of the FEEDBACK signal to determine whether it is below a threshold value.

Whenever control logic 50 determines that slope overload correction is required, it produces a pulse substantially coincident with the present value, i.e., "1" bit, of the DIGITAL OUTPUT signal, and applies it both to the SIGN TOGGLE signal lead 16 and to the HOLD signal lead 17. The bit, appearing on the SIGN TOGGLE signal lead 16, changes the state of polarity flip-flop 60 which in turn changes the state of the POLARITY INVERT signal. This inverts the polarity of the FEEDBACK signal and reverses the states of the DIGITAL OUTPUT signal. The other bit, produced by control logic 50 and appearing in the HOLD signal, is applied via lead 17 to the HOLD input terminal of digital accumulator 80. This bit prevents the contents of digital accumulator 80 from being shifted or changed while the polarity of the FEEDBACK signal is being reversed. The effect of holding the contents of digital accumulator 80 fixed results in the present value in the digital output signal, i.e., a "1" bit, never becoming part of the contents of accumulator 80.

Reversing the states of the DIGITAL OUTPUT signal, at the same time as the polarity of the FEEDBACK signal is reversed, is necessary to maintain negative feedback and circuit stability around the loop comprised of integrator 30, threshold 40, feedback circuitry 90 and combiner 20. It is readily apparent that the polarity of the output of integrator 30 or combiner 20 can be inverted in lieu of reversing the states of DIGITAL OUTPUT signal produced by threshold 40.

Slope overload correction is performed, in accordance with the principles of this invention, in one sample interval. In particular, if at the beginning of a sample interval, the two most recent values of the DIGITAL OUTPUT signal are "1" and the present value is also "1", then—assuming that the value of the FEEDBACK signal is sufficiently low—the "1" bit appearing as the present value of the DIGITAL OUTPUT signal will initiate slope overload correction. Control logic 50, coincident with a clock pulse occurring at the beginning of this sample interval, will invert the polarity of the FEEDBACK signal and reverse the states of the DIGITAL OUTPUT signal. At the same time, a pulse will be applied by control logic 50 to the HOLD signal lead 17. Once the polarity of the FEEDBACK signal and the states of the DIGITAL OUTPUT signal have been reversed, i.e., at the termination of the pulse applied to SIGN TOGGLE lead 16, the pulse on HOLD signal lead 17 will be terminated. At that point, slope overload correction will be complete. However, should the reversal far exceed the input change, the slope overload condition is again detected during the next sample interval, and the above-described process is repeated.

The control circuit located in the decoder will, in response to the stream of "1" bits present in the DIGITAL OUTPUT signal incoming from the channel, perform slope overload correction on the analog signal reconstructed at the far end in a manner identical to that occurring in the coder.

To determine when slope overload correction is required, control logic 50, shown in detail in FIG. 2, simultaneously tests the bit sequence in the DIGITAL OUTPUT signal for an occurrence of three consecutive "1's," and checks whether the magnitude of the FEEDBACK signal is below a certain threshold. The former is readily accomplished by storing the two most recent values of the DIGITAL OUTPUT signal appearing on lead 14 within shift register 51 and, together with the present value of this signal, applying all three values as inputs to AND gate 53. In particular, each value of the DIGITAL OUTPUT signal is shifted into 2-bit shift register 51 by the application to it of a delayed clock pulse. By delaying the clock pulse in delay element 59, all three values of the DIGITAL OUTPUT signal and a clock pulse are simultaneously applied to AND gate 53.

The magnitude of the FEEDBACK signal is tested to see whether it lies below a predetermined threshold, e.g., one-eighth of its maximum value, by checking the level of a bit, illustratively the fourth most significant bit, in the output of digital accumulator 80 appearing on bus 19. This bit is applied as another input to AND gate 53.

Thus, if during the occurrence of any clock pulse, the present and two most recent values of the magnitude of the DIGITAL OUTPUT signal are "1," and the FEEDBACK signal is below the threshold value, then all the inputs to AND gate 53 are high. Consequently, this gate produces a pulse at its output. This pulse is applied to lead 17 as the HOLD signal and also appears via OR gate 55 on the SIGN TOGGLE signal applied to lead 16.

It will be appreciated by those skilled in the art that while the present invention was described in the context of delta modulation, its teachings could be extended to encompass any circuit having a feedback path as a means to increase the rate of change of a feedback signal used therein such that this signal is able to follow any rapidly changing input signal applied to the circuit. Consequently, many and varied arrangements incorporating these techniques may be devised by those skilled in the art without departing from the spirit and scope of the invention.

What is claimed is:

1. A method for compensating for slope overload in a differential digital pulse code system comprising the steps of:
    combining an analog input signal with a reconstructed signal to generate an error signal,
    sampling the error signal to produce a digital signal,
    generating said reconstructed signal in response to said digital signal,
    detecting an occurrence of slope overload, and
    reversing the polarity of said reconstructed signal when such occurrence of slope overload is detected.

2. The invention in claim 1 wherein said reversing step further includes the step of
    holding the magnitude of said reconstructed signal fixed when its polarity is reversed.

3. The invention in claim 2 wherein said reversing step further includes the step of
    switching the states of bits comprising said digital signal.

4. The invention of claims 1 or 2 wherein said detecting step further includes the step of
    determining whether the analog input signal amplitude is changing according to a predetermined criteria throughout a predetermined interval of time.

5. The invention in claim 4 wherein said determining step includes the step of testing whether the digital signal indicates continuous change of the analog input signal over a predetermined interval of time.

6. The invention in claim 5 wherein said detecting step further includes the steps of
    ascertaining if the value of said reconstructed signal lies below a predetermined threshold, and
    identifying the such occurrence of slope overload when the digital signal testing indicates continuous change and the value ascertaining indicates that the reconstructed signal lies below the predetermined threshold.

7. The invention in claim 4 wherein said generating step includes the steps of
    synthesizing an accumulated signal from said digital signal, and
    converting said accumulated signal to said reconstructed analog signal.

8. The invention of claim 7 wherein said synthesizing step includes the step of
    integrating said digital signal to produce said accumulated signal.

9. A coder, which corrects for slope overload comprising
    means for combining an analog input signal and a reconstructed analog signal to form an error signal,
    means for sampling the error signal to produce a digital signal,
    means for generating said reconstructed analog signal in response to said digital signal, and
    means for detecting an occurrence of slope overload characterized in that
    said generating means further includes means for reversing the polarity of said reconstructed analog signal in response to an occurrence of slope overload.

10. The invention in claim 9 wherein said reversing means further includes means for
    holding the magnitude of said reconstructed analog signal fixed while its polarity is being reversed.

11. The invention in claim 10 wherein said reversing means further includes
    means for switching the states of the bits comprising said digital signal.

12. The invention in claims 9 or 10 wherein said detecting means includes means for determining whether the analog input signal amplitude is changing according to a predetermined criteria throughout a predetermined interval of time.

13. The invention in claim 12 wherein said determining means includes means for testing whether the digital signal indicates continuous change in the analog input signal over a predetermined interval of time.

14. The invention in claim 13 wherein said determining means further includes
    means for ascertaining if the value of said reconstructed signal lies below a predetermined threshold, and
    means for identifying the such occurrence of slope overload when the testing means indicates continuous change and the ascertaining means indicates that the reconstructed signal lies below the predetermined threshold.

15. The invention in claim 12 wherein said generating means includes
    means for synthesizing an accumulated signal from said digital signal, and
    means for converting said accumulated signal to said reconstructed analog signal.

16. The invention in claim 15 wherein said synthesizing means includes
    means for integrating said digital signal to produce said accumulated signal.

17. In an arrangement, for processing a digital signal derived from the difference between an analog input signal and an analog signal which approximates the analog input signal from a prior time interval,
    means for reconstructing an analog signal from said digital signal
    characterized in that
    said reconstructing means further includes means for reversing the polarity of said reconstructed analog signal in response to a slope overload condition.

18. The invention in claim 17 wherein said reversing means further includes means for holding the magnitude of the reconstructed analog signal fixed while its polarity is being reversed.

19. The invention in claim 18 wherein said reversing means further includes means for switching the states of the bits comprising said digital signal.

20. The invention in claims 17 or 18 wherein said reconstructing means further includes means for determining whether the digital signal amplitude is changing according to a predetermined criteria throughout a predetermined interval of time.

21. The invention in claim 20 wherein said determining means includes means for testing whether the digital signal indicates continuous change of the analog input signal over a predetermined interval of time.

22. The invention in claim 21 wherein said determining means further includes
    means for ascertaining if the value of said reconstructed signal lies below a predetermined threshold, and
    means for testing whether the digital signal indicates continuous change in the analog input signal.

23. The invention in claim 22 wherein said testing means further includes
    means for storing a plurality of previous values of said digital signal, and
    gating means operative in response to said plurality of previous values and the present value of said digital signal for enabling the polarity reversing means.

* * * * *